(12) United States Patent
Fujita et al.

(10) Patent No.: US 8,328,066 B2
(45) Date of Patent: Dec. 11, 2012

(54) BONDING TOOL AND ELECTRONIC COMPONENT MOUNTING APPARATUS AND METHOD

(75) Inventors: Ryo Fujita, Hyogo (JP); Hiroshi Ebihara, Osaka (JP); Katsuhiko Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 12/711,744

(22) Filed: Feb. 24, 2010

(65) Prior Publication Data

US 2010/0219229 A1  Sep. 2, 2010

(30) Foreign Application Priority Data

Mar. 2, 2009  (JP) ................................. 2009-048443
Feb. 10, 2010  (JP) ................................. 2010-027755

(51) Int. Cl.
  *B23K 1/06* (2006.01)
(52) U.S. Cl. .......................... 228/1.1; 29/739; 228/110.1
(58) Field of Classification Search .................... 228/1.1, 228/110.1; 29/739
  See application file for complete search history.

(56) References Cited

U.S. PATENT DOCUMENTS

2005/0227429 A1 * 10/2005 Minamitani et al. .......... 438/222
2009/0265924 A1  10/2009 Ebihara et al.

FOREIGN PATENT DOCUMENTS

JP  2004-095810 A  3/2004
WO  WO 2007/129700 A1  11/2007

OTHER PUBLICATIONS

Korean Office Action for Application No. 10-2010-0016911, Jul. 28, 2011, Panasonic Corporation.

* cited by examiner

*Primary Examiner* — Nicholas D'Aniello
(74) *Attorney, Agent, or Firm* — RatnerPrestia

(57) ABSTRACT

A bonding tool, including: a component mounting unit including a horn that has a heater insertion hole, in which a heater is inserted with a predetermined clearance, and transmits ultrasonic vibration, an ultrasonic transducer that is fixed on the horn and produces the ultrasonic vibration, and an electronic component holder that is fixed on the horn, holds an electronic component and is heated by the heater; a leg that supports the horn on both sides of the horn at nodal points of the ultrasonic vibration on the horn; a supporter that holds the leg; and a heater holder that holds the heater on both sides of the horn, wherein the leg and the heater holder are formed integrally with each other.

18 Claims, 11 Drawing Sheets

BONDING TOOL AND ELECTRONIC COMPONENT MOUNTING APPARATUS AND METHOD

BACKGROUND OF THE INVENTION

1. Field of the Invention

The present invention relates to a bonding tool, an electronic component mounting apparatus and an electronic component mounting method for mounting electronic components on a circuit board or the like.

2. Related Art of the Invention

There are various known methods for bonding electrodes of electronic components to electrodes on a circuit board. For example, ultrasonic bonding is one such bonding method which is capable of bonding electronic components to a circuit board in a short time.

The ultrasonic bonding method uses ultrasonic vibrations to vibrate an electronic component held by an electronic component holder heated by a heater while pressing the electronic component against a circuit board to electrically bond electrodes of the electronic component to electrodes on the circuit board.

Referring to FIG. 11, a configuration and operation of a conventional electronic component mounting apparatus that uses the ultrasonic bonding method will be described.

FIG. 11 is a schematic front elevation view of a conventional electronic component mounting apparatus.

The conventional electronic component mounting apparatus includes a bonding tool 9003 holding an electronic component 1, a circuit board holding unit 9006 holding a circuit board 2, and a pressing unit (not shown) pressing the electronic component 1 held by the bonding tool 9003 against the circuit board 2 held by the circuit board holding unit 9006 (see for example WO2007/129700, in particular p. 1 and FIG. 6).

The entire disclosure of WO2007/129700 is incorporated herein by reference in its entirety.

The bonding tool 9003 includes a component mounting unit 9030, a leg 9312, a supporter 9005, and a heater holder 9324. The leg 9312 and the heater holder 9324 are separately formed and apart from each other.

The component mounting unit 9030 includes a horn 9031, an ultrasonic transducer 9004, and an electronic component holder 9009.

The horn 9031 is a unit which transmits ultrasonic vibrations and has a heater insertion hole 9311 in which a heater 9033 is inserted with a predetermined clearance from the wall of the heater insertion hole 9311. The ultrasonic transducer 9004 is a unit which is fixed at one end on the +X side of the horn 9031 and produces ultrasonic vibrations. The electronic component holder 9009 is a unit fixed on the other end of the horn 9031, holds the electronic component 1, and is heated by the heater 9033.

The supporter 9005 supports the leg 9312 and the heater holder 9324.

The leg 9312 holds the horn 9031 at the nodal point P0 of ultrasonic vibration of the horn 9031 across the horn 9031 from both +Y and −Y sides of the horn 9031.

The heater holder 9324 holds the heater 9033 across the heater 9033 from both of the +Y side and −Y side of the horn 9031.

The electronic component 1 held by the bonding tool 9003 is pressed against a circuit board 2 by the pressing unit (not shown) and heat and ultrasonic vibration are applied at the same time to the electronic component 1. Electrodes of the electronic component 1 are bonded to electrodes on the circuit board 2 by using the heat and ultrasonic vibration.

SUMMARY OF THE INVENTION

However, the above-described conventional electronic component mounting apparatus has been found to have a difficulty in improving the quality of ultrasonic bonding.

The present inventor has conducted analysis and found that the cause is contact of the heater 9033 with the wall of the heater insertion hole 9311.

More specifically, when heated by the heater 9033, the heater holder 9324 thermally expands in the direction indicated by arrow B, that is, in the −Z direction. As a result, the heater 9033 is also displaced in the direction indicated by arrow B.

The heating also thermally expands the horn 9031 in the direction indicated by arrow A. As a result, the heater insertion hole 9311 is also displaced in the direction indicated by arrow A.

On the other hand, the nodal point P0 of the leg 9312 on which the horn 9031 is fixed is not displaced.

Therefore, during heating by the heater 9033, the heater 9033 can come in contact with the wall of the heater insertion hole 9311.

In light of the problem with the conventional electronic component mounting apparatuses, an object of the present invention is to provide a bonding tool, an electronic component mounting apparatus, and an electronic component mounting method capable of higher-quality ultrasonic bonding.

The $1^{st}$ aspect of the present invention is a bonding tool, comprising:

a component mounting unit including a horn that has a heater insertion hole, in which a heater is inserted with a predetermined clearance, and transmits ultrasonic vibration, an ultrasonic transducer that is fixed on the horn and produces the ultrasonic vibration, and an electronic component holder that is fixed on the horn, holds an electronic component and is heated by the heater;

a leg that supports the horn on both sides of the horn at nodal points of the ultrasonic vibration on the horn;

a supporter that holds the leg; and a heater holder that holds the heater on both sides of the horn, wherein the leg and the heater holder are formed integrally with each other.

The $2^{nd}$ aspect of the present invention is the bonding tool according to the $1^{st}$ aspect of the present invention, wherein the leg is provided on both sides of the horn, and each part of the leg on each side is separated into two parts spaced apart by a predetermined distance along the direction in which the ultrasonic vibration is transmitted, and the heater holder is provided on both sides of the horn, and each part of the heater holder on each side is disposed in the in-between space between the two parts of each part of the leg.

The $3^{rd}$ aspect of the present invention is the bonding tool according to the $2^{nd}$ aspect of the present invention, wherein each part of the leg separated into the two parts spaced apart by the predetermined distance and each part of the heater holder disposed in the in-between space are formed integrally with each other.

The $4^{th}$ aspect of the present invention is the bonding tool according to the $3^{rd}$ aspect of the present invention, wherein the supporter has a shape of a plate, the leg is fixed on a bottom surface of the supporter, the heater holder is disposed alongside the leg, and a predetermined space is formed between the supporter and the heater holder.

The 5th aspect of the present invention is the bonding tool according to the 4th aspect of the present invention, wherein
the horn has a shape of a prism with the longitudinal direction in which the ultrasonic vibration is transmitted,
the heater insertion hole is bored completely through the horn in the direction orthogonal to the direction in which the ultrasonic vibration is transmitted, and
a heater holding hole for holding the heater is formed in the heater holder provided on both sides of the horn, respectively.

The 6th aspect of the present invention is the bonding tool according to the 5th aspect of the present invention, wherein
the heater has a shape of a cylinder, and
a central axis of the heater holding hole coincides with a central axis of the heater insertion hole.

The 7th aspect of the present invention is the bonding tool according to the 6th aspect of the present invention, wherein
the heater insertion hole is bored completely through the horn in the direction orthogonal to side surfaces on both sides of the horn.

The 8th aspect of the present invention is the bonding tool according to the 7th aspect of the present invention, wherein
the heater has two heaters,
the heater insertion hole and the heater holding hole are formed correspondingly to the two heaters, respectively, and
an aperture of each of the heater insertion holes has a shape of an ellipse elongated in the direction in which the ultrasonic vibration is transmitted.

The 9th aspect of the present invention is the bonding tool according to the 7th aspect of the present invention, wherein
the central axis of the heater insertion hole is orthogonal to a central axis of the horn in the longitudinal direction, and
the heater insertion hole is symmetrical with respect to a plane that includes the central axis of the heater insertion hole and is orthogonal to the central axis of the horn in the longitudinal direction.

The 10th aspect of the present invention is the bonding tool according to the 7th aspect of the present invention, wherein
the central axis of the heater insertion hole is orthogonal to a central axis of the horn in the longitudinal direction, and
the heater insertion hole is symmetrical with respect to a plane that includes the central axis of the horn in the longitudinal direction and is orthogonal to the central axis of the heater insertion hole.

The 11th aspect of the present invention is the bonding tool according to the 7th aspect of the present invention, wherein
the central axis of the heater insertion hole is orthogonal to a central axis of the horn in the longitudinal direction, and
the heater insertion hole is symmetrical with respect to a plane that includes the central axis of the heater insertion hole and the central axis of the horn in the longitudinal direction.

The 12th aspect of the present invention is the bonding tool according to the 7th aspect of the present invention, wherein
four locations at which the leg is fixed on the supporter are symmetrical with respect to a plane that includes the central axis of the heater insertion hole and is orthogonal to a central axis of the horn in the longitudinal direction and further symmetrical with respect to a plane that includes the central axis of the horn in the longitudinal direction and is orthogonal to the central axis of the heater insertion hole.

The 13th aspect of the present invention is the bonding tool according to the 1st aspect of the present invention, wherein
the horn has, as a cooling unit, air holes.

The 14th aspect of the present invention is the bonding tool according to the 1st aspect of the present invention, wherein
air holes are formed in locations in the leg that are adjacent to the heater holder.

The 15th aspect of the present invention is the bonding tool according to the 1st aspect of the present invention, wherein
air holes are formed in locations in the supporter that are adjacent to the leg.

The 16th aspect of the present invention is the bonding tool according to the 1st aspect of the present invention, wherein
a thermometer insertion hole, into which a thermometer is inserted, is formed in the horn.

The 17th aspect of the present invention is the bonding tool according to the 1st aspect of the present invention, wherein
an amount of the predetermined clearance is equal to or more than 0.075 mm and is equal to or less than 0.1 mm.

The 18th aspect of the present invention is an electronic component mounting apparatus, comprising:
the bonding tool according to the 1st aspect of the present invention that holds the electronic component;
a circuit board holding unit that holds a circuit board; and
a pressing unit that presses the electronic component held by the bonding tool against the circuit board held by the circuit board holding unit.

The 19th aspect of the present invention is an electronic component mounting method of mounting the electronic component on the circuit board using the electronic component mounting apparatus according to the 18th aspect of the present invention, the electronic component mounting method comprising:
an electronic component holding step of holding the electronic component using the bonding tool;
a circuit board holding step of holding the circuit board using the circuit board holding unit;
a pressing step of pressing the electronic component held by the bonding tool against the circuit board held by the circuit board holding unit using the pressing unit;
an ultrasonic vibration producing step of producing the ultrasonic vibration using the ultrasonic transducer; and
a heating step of heating the electronic component holder using the heater.

With the configuration of the present invention, a bonding tool, an electronic component mounting apparatus, and an electronic component mounting method capable of higher-quality ultrasonic bonding can be provided.

Figure 1:
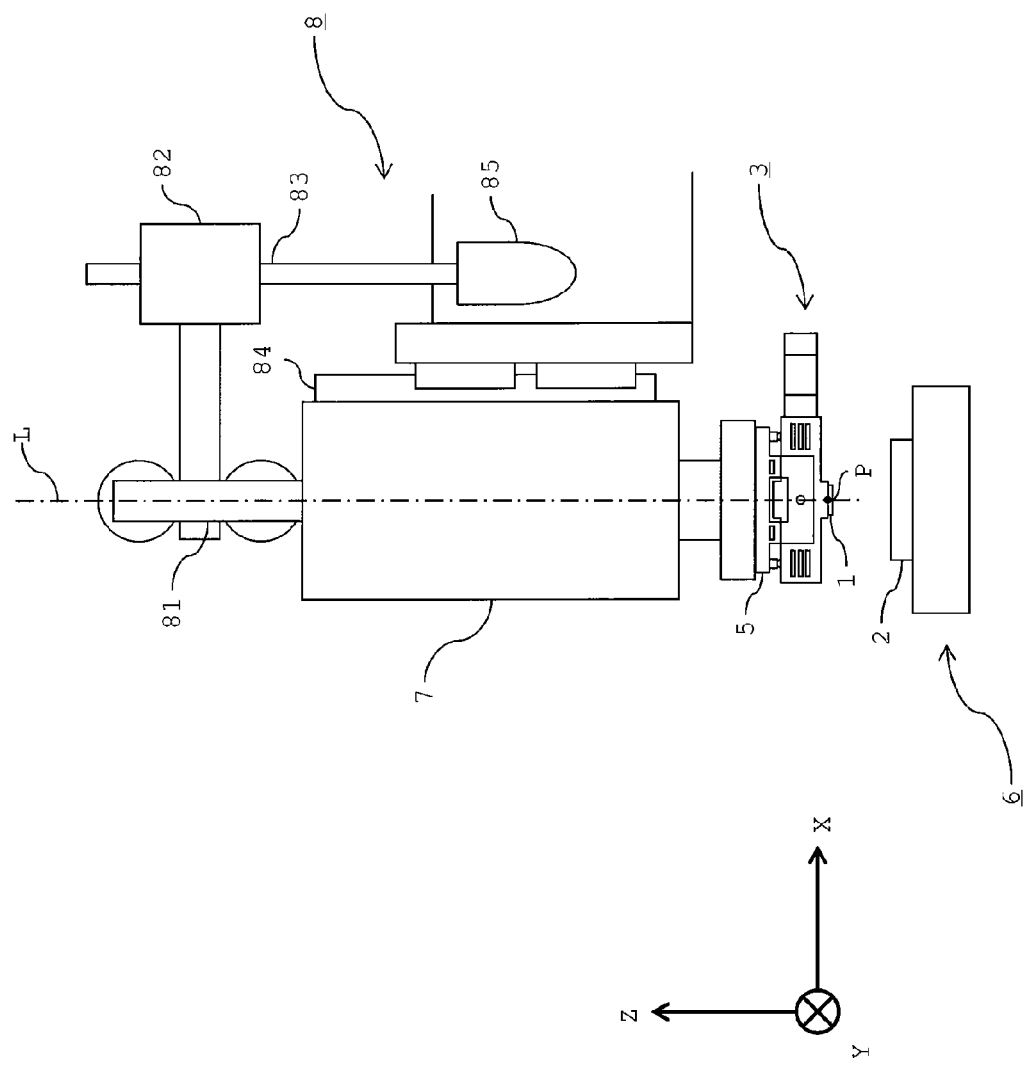
FIG. 1 is a schematic front elevation view of an electronic component mounting apparatus according to an embodiment of the present invention.

Description of Symbols 1 electronic component
2 circuit board
3 bonding tool
30 component mounting unit
31 horn
311, 311a, 311b heater insertion holes
312 leg
3121, 3122, 3123, 3124 ribs
313 first cooling unit
3131 vertical hole
3132 suction pad
3133 tube
314 second cooling unit
3211, 3212, 3213, 3214 leg air holes
3221, 3222, 3223, 3224 bolt-holes
3231, 3232, 3233, 3234 bolts
324 heater holder
325, 325a, 325b heater holding holes
33, 33a, 33b heaters
331 heater flange
332 heater power supply line
333, 334 spacers
335, 336 bolts
34 thermometer insertion hole
4 ultrasonic transducer
5 supporter
5a, 5b ridges
511, 512 supporter air holes
6 circuit board holding unit
7 bonding head
8 pressing unit
81 coupling section
82 block
83 driving mechanism
84 guide
85 actuator
9 electronic component holder

PREFERRED EMBODIMENTS OF THE INVENTION

Embodiments of the present invention will be described below in detail with reference to the accompanying drawings.

Referring to FIG. 1 in particular, a configuration and operation of an electronic component mounting apparatus and an electronic component mounting method according to an embodiment of the present invention will be described first.

FIG. 1 is a schematic front elevation view of an electronic component mounting apparatus according to an embodiment of the present invention.

The electronic component mounting apparatus according to the present embodiment includes a bonding tool 3 which holds an electronic component 1, a circuit board holding unit 6 which holds a circuit board 2, and a pressing unit 8 which presses the electronic component 1 held by the bonding tool 3 against the circuit board 2 held by the circuit board holding unit 6.

Configurations of the pressing unit 8 and the bonding tool 3 will be described in further detail in this order.

A configuration of the pressing unit 8 will be described first.

The pressing unit 8 includes an actuator 85 such as an alternating current (AC) servo motor.

A driving mechanism 83 such as a ball screw is combined with the actuator 85 and the driving force from the actuator 85 is transmitted to a coupling section 81 through a block 82. The coupling section 81 is disposed in such a manner that the point receiving the driving force from the actuator 85 is on a line L along the Z direction that passes the mounting center point P at which the electronic component 1 is mounted on the circuit board 2. A bonding head 7 which holds the bonding tool 3 is disposed on the −Z side of the coupling section 81 and is moved in the Z direction along a guide 84 by the driving force of the actuator 85.

The electronic component 1 held by the bonding tool 3 is pressed against the circuit board 2 by the pressing unit 8 while heat and ultrasonic vibration are applied to the electronic component 1 at the same time. Electrodes of the electronic component 1 are bonded to electrodes on the circuit board 2 by using the heat and the ultrasonic vibration.

To facilitate bonding, conductive protrusions such as bumps may be provided on electrodes of the electronic component 1 and/or circuit board 2.

Figure 2:
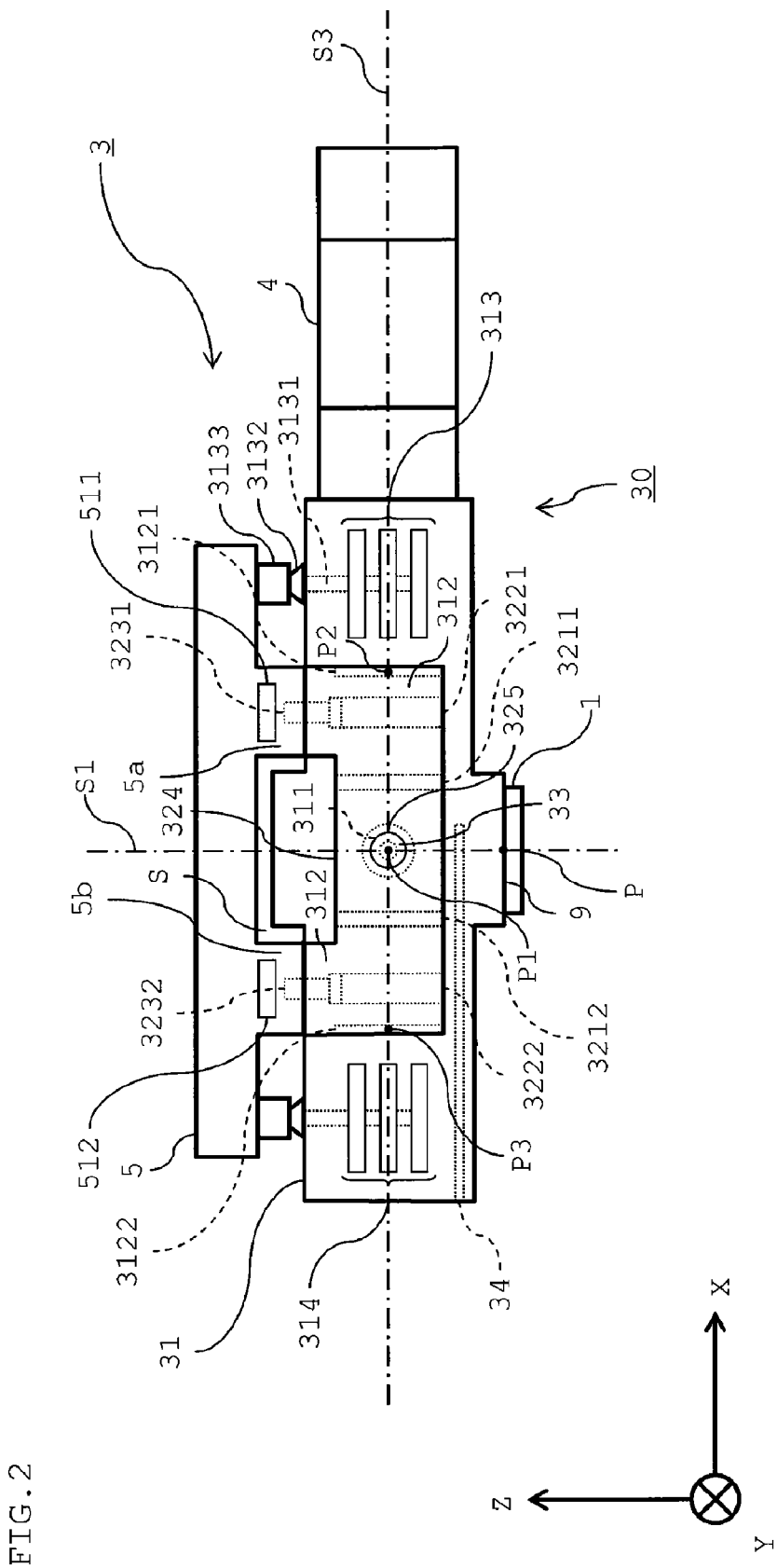
FIG. 2 is a schematic front elevation view of a bonding tool according to the embodiment of the present invention.
Figure 3:
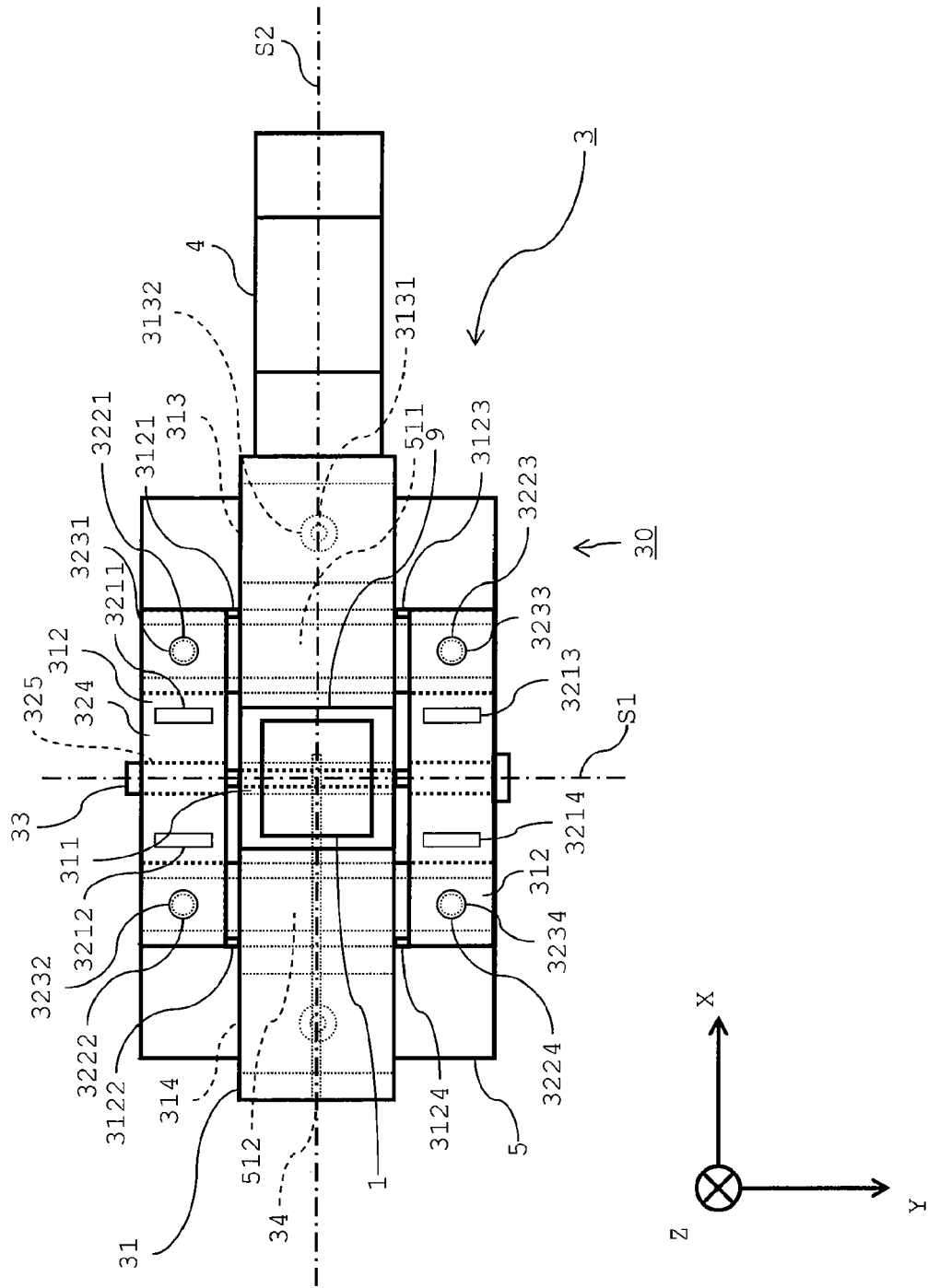
FIG. 3 is a schematic bottom view of the bonding tool according to the embodiment of the present invention.

Referring to FIGS. 2 and 3 in particular, a configuration of the bonding tool 3 will be described in detail.

FIG. 2 is a schematic front elevation view of the bonding tool 3 according to the embodiment of the present invention. FIG. 3 is a schematic bottom view of the bonding tool 3 according to the embodiment of the present invention.

The bonding tool 3 includes a component mounting unit 30, a leg 312, a supporter 5, and a heater holder 324. The heater holder 324 is formed integrally with the leg 312 as will be described later in further detail.

The component mounting unit 30 includes a horn 31, an ultrasonic transducer 4, and an electronic component holder 9.

The horn 31, a unit which transmits ultrasonic vibration, has a heater insertion hole 311 in which a heater 33 such as a cartridge heater is inserted with a predetermined clearance from the wall of the heater insertion hole 311. The horn 31 has a structure that resonates at a predetermined frequency of ultrasonic vibration. The horn 31 is generally prismatic in shape, has the length in the X direction in which ultrasonic vibration is transmitted. The horn 31 has a plane of symmetry (a plane that divides the length into two equal parts) S1 parallel to the YZ plane, a plane of symmetry S2 parallel to the ZX plane, and a plane of symmetry S3 parallel to the XY plane. The central axis of the horn 31 in the longitudinal direction is the line of intersection of the planes of symmetry S2 and S3.

While the horn 31 in the present embodiment has a prismatic shape, the horn 31 may have other shape such as the shape of a cylinder, of course.

The bonding tool 3 has various highly symmetric properties with respect to the planes of symmetry S1, S2 and S3, as will be described later in detail.

Accordingly, the heat distribution in, and hence the thermal distortion of the bonding tool 3, is substantially uniform in all directions during heating by the heater 33. Therefore, the possibility of deviation of vibration mode of the electronic component 1 held by the bonding tool 3 from a predetermined design value is significantly reduced. This practically eliminates the need for parallel adjustment of the apparatus, for example, for preventing damage or poor bonding of electrodes of electronic components 1 or circuit boards 2 which would otherwise be caused by a tilt of the electronic component 1 with respect to the circuit board 2 (see FIG. 1).

The ultrasonic transducer 4 is a unit which is fixed at the end on the +X side of the horn 31 and uses a piezoelectric element (not shown) to produce ultrasonic vibration.

Ultrasonic vibration produced by the ultrasonic transducer 4 is transmitted by the horn 31 to the electronic component holder 9 as longitudinal vibration and is applied to the electronic component 1 through the electronic component holder 9.

An antinodal point P1 indicates a point in the X direction that corresponds to a loop where the amplitude of ultrasonic vibration is at the maximum in a resonant state. Ultrasonic vibration in the present embodiment has two nodes. The nodal point P2 closer to the end on the +X side of the horn 31 and the nodal point P3 closer to the end on the −X side of the horn 31 indicate positions in the X direction that correspond to nodes at which the amplitude of ultrasonic vibration is practically zero in a resonant state. The antinodal point P1 is on the plane of symmetry S1 and the nodal points P2 and P3 are nearly symmetrical to each other with respect to the plane of symmetry S1.

The electronic component holder 9 is a unit which is fixed on the horn 31, holds the electronic component 1, and is heated by the heater 33. The electronic component holder 9 is provided on the bottom surface of the horn 31 with respect to the location of the antinodal point P1. The electronic component 1 is held at the mounting center point P on the line of intersection between the planes of symmetry S1 and S2 by vacuum suction.

The supporter 5 has the shape of a plate parallel to the XY plane and has ridges 5a and 5b which are located in two positions on the bottom surface in the longitudinal direction (the X direction) and extend in the Y direction. The supporter 5 holds the leg 312 at two locations in the lateral direction on the bottom surface of each of the ridges 5a and 5b, at four locations in total, with bolts as will be described later.

In this way, the leg 312 is fixed on the ridges 5a and 5b of the supporter 5. The four locations at which the leg 312 is fixed on the ridges 5a and 5b are symmetrical with respect to the plane of symmetry S1 including the central axis of the heater insertion hole 311 and being orthogonal to the central axis of the horn 31 in the longitudinal direction and to the plane of symmetry S2 including the central axis of the horn 31 in the longitudinal direction and being orthogonal to the central axis of the heater insertion hole 311. More specifically, bolt-holes 3221, 3222, 3223 and 3224 into which bolts 3231, 3232, 3233 and 3234, respectively, are inserted are formed in the four locations on the leg 312 symmetrically with respect to both of the planes of symmetry S1 and S2.

On the top surface of the supporter 5, on the other hand, a bonding head 7 (see FIG. 1) is fixed.

The leg 312 supports the horn 31 at the nodal points P2 and P3 of ultrasonic vibration on the horn 31 on the +Y side and −Y side of the horn 31.

More specifically, the leg 312 supports the horn 31 at four locations with ribs 3121, 3122, 3123 and 3124 elongated in the Z direction. This arrangement can ensure a sufficient stiffness to transmit pressing force in the Z direction along which the pressing unit 8 presses the electronic component 1.

The ribs 3121 and 3123 are located with respect to the position of the nodal point P2 and the ribs 3122 and 3124 are located with respect to the position of the nodal point P3. This ensures a sufficient flexibility to allow the electronic component 1 to vibrate ultrasonically, in the X direction in which ultrasonic vibration produced by the ultrasonic transducer 4 is transmitted.

The heater holder 324 holds the heater 33 on the +Y and −Y sides of the horn 31.

As has been described, the leg 312 is provided on the +Y and −Y sides of the horn 31. Each part of the leg 312 on each side is separated into two parts spaced apart by a predetermined distance along the X direction in which ultrasonic vibration is transmitted. Consequently, the leg 312 is separated into four parts in total. The heater holder 324 is provided on the +Y and −Y sides of the horn 31, as described above, in the space between the parts of the leg 312 integrally with the leg 312 on each side. Specifically, the leg 312 separated into the two parts spaced apart by the predetermined distance and the heater holder 324 provided in the space alongside the leg 312 in the X direction are formed integrally with each other.

The predetermined space S is provided between the bottom surface of the supporter 5 and the heater holder 324.

The leg 312 and the heater holder 324 are formed integrally with each other as described above in the present embodiment and the horn 31 is also formed integrally with the leg 312 and the heater holder 324.

More specifically, the leg 312 and the heater holder 324 are formed from a single material by wire cutting in such a manner that the leg 312 and the heater holder 324 are contiguous with the horn 31 at four locations with the ribs 3121, 3122, 3123 and 3124. The heater insertion hole 311 and a heater holding hole 325 are formed by a single boring operation so that their central axes coincide with each other. Since the wire cutting and boring with that high precision are used, there is little variation in characteristics such as vibration property among individual bonding tools 3.

Since the ribs 3121 and 3123 are located with respect to the position of the nodal point P2 and ribs 3122 and 3124 are located with respect to the position of the nodal point P3 as described above, ultrasonic vibration produced by the ultrasonic transducer 4 is hardly transmitted to the heater holder 324 provided between the two parts of the leg 312. Therefore, ultrasonic vibration produced by the ultrasonic transducer 4 causes little displacement of the heater 33 held by the heater holder 334 formed integrally with the leg 312. Furthermore, ultrasonic vibration is hardly transmitted to the supporter 5 on which the leg 312 is fixed.

On the other hand, the supporter 5 is hardly displaced by heating by the heater 33 whereas the leg 312 is displaced in the −Z direction viewed from the supporter 5 due to thermal expansion.

However, since the leg 312, the heater holder 324 and the horn 31 are formed integrally as described above, the heater holder 324 and the horn 31 are displaced in the −Z direction together with the leg 312. Therefore, the relative positional relationship between the heater holder 324 and the horn 31 practically remains substantially the same.

Accordingly, there is little likelihood that the heater 33 held by the heater holder 324 will come into contact with the wall of the heater insertion hole 311 formed in the horn 31 during heating by the heater 33.

Therefore, the present embodiment enables never-before-possible high-quality ultrasonic bonding in a high temperature range that is applicable to semiconductor flip-chip mounting involving gold-to-gold bonding.

The heater 33 is substantially cylindrical in shape, has the length in the Y direction orthogonal to the X direction in which ultrasonic vibration is transmitted, and has planes of symmetry S1, S2 and S3.

While the heater 33 in the present embodiment has a cylindrical shape, the heater 33 may have other shape such as a prismatic shape, of course. It would be understood that the heater insertion hole 311 and the heater holding hole 325 may have any shape that conforms to the shape of the heater 33.

The heater holding hole 325 for holding the heater 33 is formed in the heater holder 324 of the leg 312 provided on each of the +Y and −Y sides of the horn 31. The central axis of the heater holding hole 325 coincides with the central axis of the heater insertion hole 311.

The heater insertion hole 311 is orthogonal to the X direction in which ultrasonic vibration is transmitted and is bored completely through the horn 31 in the direction orthogonal to the side surfaces on the +Y and −Y sides of the horn 31. The central axis of the horn 31 in the longitudinal direction is the line of intersection of the planes of symmetry S2 and S3 as described above. The central axis of the heater insertion hole 311 is on the line of intersection of the planes of symmetry S1 and S3. Accordingly, the central axis of the heater insertion hole 311 is orthogonal to the central axis of the horn 31 in the longitudinal direction.

The heater insertion hole 311 is symmetrical with respect to: (1) the plane of symmetry S1 that includes the central axis of the heater insertion hole 311 and is orthogonal to the central axis of the horn 31 in the longitudinal direction, (2) the plane of symmetry S2 that includes the central axis of the horn 31 in the longitudinal direction and is orthogonal to the central axis of the heater insertion hole 311, and (3) the plane of symmetry S3 that includes the central axis of the heater insertion hole 311 and the central axis of the horn 31 in the longitudinal direction.

The horn 31 has a first cooling unit 313 and a second cooling unit 314 provided by utilizing air holes formed in locations adjacent to the heater insertion hole 311.

The first cooling unit 313 is provided between the end on the +X side of the horn 31 at which the ultrasonic transducer 4 is fixed and the heater insertion hole 311. The first cooling unit 313 is formed nearly symmetrically with respect to the planes of symmetry S2 and S3 by utilizing three air holes bored completely through the horn 31 in the Y direction orthogonal to the X direction in which ultrasonic vibration is transmitted.

The three air holes are coupled to an air pump (not shown) through a suction pad 3132 coupled to a tube 3133 through a vertical hole 3131.

Accordingly, the first cooling unit 313 can inhibit—for example, failures of the ultrasonic transducer 4, which has heat resistance up to approximately 100 degrees C., that would otherwise be caused by heat conducted through the horn 31.

The second cooling unit 314 has the same configuration as the first cooling unit 313. The second cooling unit 314 is provided between the end of the horn 31 on the −X side and the heater insertion hole 311 nearly symmetrically to the first cooling unit 313 with respect to the plane of symmetry S1.

Accordingly, the second cooling unit 314 can inhibit, for example, unequal distances between electrodes of the electronic component 1 and electrodes on the circuit board 2 (see FIG. 1) resulting from tilt of the electronic component 1 with respect to the circuit board 2 caused by asymmetrical thermal expansion of the horn 31 on the −X and +X sides.

Leg air holes 3211, 3212, 3213 and 3214 are formed in locations in the leg 312 that are adjacent to the heater holder 324 in such a manner that the leg air holes 3211, 3212, 3213 and 3214 are symmetrically with respect to both of the planes of symmetry S1 and S2.

The leg air hole 3211 is formed on the +X side of the plane of symmetry S1 and on the −Y side of the plane of symmetry S2 completely through the leg 312 in the Z direction. The leg air hole 3212 is formed on the −X side of the plane of symmetry S1 and on the −Y side of the plane of symmetry S2 completely through the leg 312 in the Z direction. The leg air hole 3213 is formed on the +X side of the plane of symmetry S1 and on the +Y side of the plane of symmetry S2 completely through the leg 312 in the Z direction. The leg air hole 3214 is formed on the −X side of the plane of symmetry S1 and on the +Y side of the plane of symmetry S2 completely through the leg 312 in the Z direction.

The leg air holes 3211, 3212, 3213 and 3214 formed in this way can reduce heat dissipation through the leg 312 to inhibit significant distortion of the supporter 5, for example, located ahead of the leg 312.

Supporter air holes 511 and 512 are formed in locations in the ridges 5a and 5b respectively of the supporter 5 that are adjacent to the leg 312, in such a manner that the supporter air holes 511 and 512 are symmetrical with respect to the plane of symmetry S1.

The supporter air hole 511 is formed on the +X side of the plane of symmetry S1 completely through the supporter 5 in the Y direction. The supporter air hole 512 is formed on the −X side of the plane of symmetry S1 completely through the supporter 5 in the Y direction.

Accordingly, the supporter air holes 511 and 512 can reduce heat dissipation through the supporter 5 to inhibit, for example, distortion of the bonding head 7 (see FIG. 1) located ahead of the supporter 5.

A thermometer insertion hole 34 is formed in the horn 31. The thermometer insertion hole 34 is supported by a thermometer supporting plate (not shown). A thermometer (not shown) such as a thermocouple or a radiation thermometer is inserted into the thermometer insertion hole 34 with a predetermined gap from the wall of the thermometer insertion hole 34.

The thermometer insertion hole 34 is bored from the end on the −X side of the horn 31 to a point in the vicinity of the electronic component holder 9 heated by the heater 33 in the X direction in which ultrasonic vibration is transmitted, so that the thermometer insertion hole 34 is a symmetrical with respect to the plane of symmetry S2.

The thermometer is inserted to such a depth that the thermometer does not come into contact with the end of the thermometer insertion hole 34 during generation of ultrasonic vibration by the ultrasonic transducer 4 and generation of heat by the heater 33. The predetermined gap is chosen to be large enough to prevent contact of the thermometer with the wall of the thermometer insertion hole 34.

Of course, it is desirable that the correlation between temperature measured by the thermometer and temperature of the electronic component 1 held by the electronic component holder 9 be determined in advance and a feedback that takes into consideration the correlation be used to perform precise temperature control.

The heater 33 is inserted into the heater insertion hole 311 with the predetermined clearance as described above. The amount of the clearance 8, as illustrated in FIG. 4, is preferably equal to or more than 0.075 mm and is equal to or less than 0.1 mm in view of the heating ability of the heater 33 and the precision of boring of the heater insertion hole 311.

Figure 4:
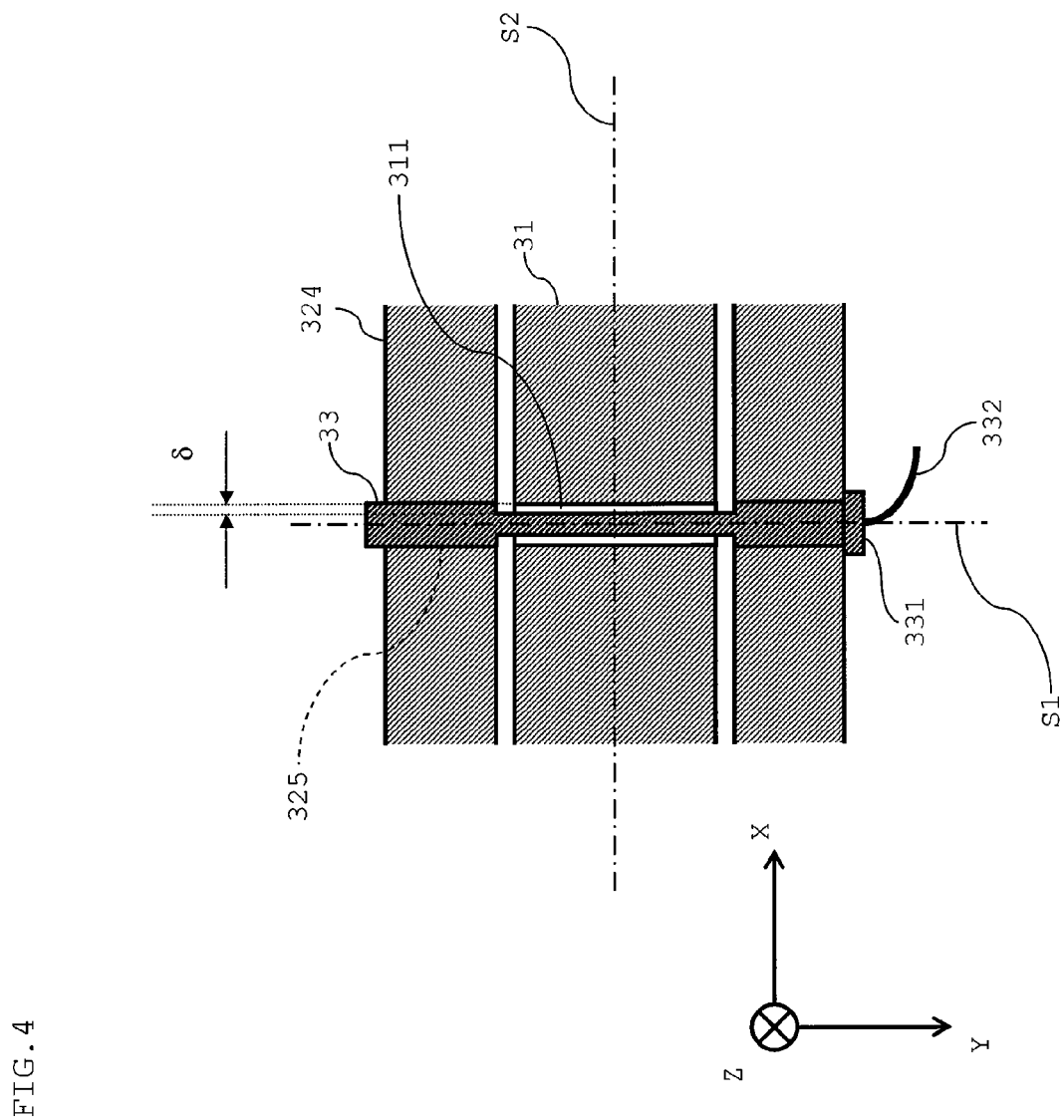
FIG. 4 is a schematic enlarged cross-sectional view of a heater insertion hole, a heater holding hole and a heater of the bonding tool according to the embodiment of the present invention.

FIG. 4 is a schematic cross-sectional view of and around the heater insertion hole 311 and the heater holding hole 325 of the bonding tool 3 according to the embodiment of the present invention.

If the clearance is too small, the heater 33 can come into contact with the wall of the heater insertion hole 311 during generation of ultrasonic vibration by the ultrasonic transducer 4 (see FIG. 2) and heating by the heater 33. Therefore the amount of the clearance 8 is chosen to be large enough to prevent contact of the heater 33 with the wall of the heater insertion hole 311.

Too large a clearance can result in inefficient heating, even taking into consideration thermal radiation and thermal convection. Therefore the amount of the clearance 6 is chosen to be small enough to avoid such inefficient heating.

The predetermined clearance in the embodiment described above is, as illustrated in FIG. 4 created by cutting to reduce the diameter of the stick section of the main body between the head and tail of the heater 33 having a heater flange 331 to which a heater power supply line 332 is connected.

The embodiment has the drawback that it is rather difficult to ensure high cutting precision because only the main body section between the head and tail has to be reduced to a smaller diameter. However, the embodiment has the following advantages. The cutting results in little wobble of the heater 33 in the heater holding hole 325 at the head and tail. The heater 33, the heater insertion hole 311 and the heater holding hole 325 are formed symmetrically with respect to all of the planes of symmetry S1, S2 and S3 (see FIG. 2 and FIG. 3) and the heater insertion hole 311 and the heater holding hole 325 can be formed easily by a single boring operation.

Figure 5:
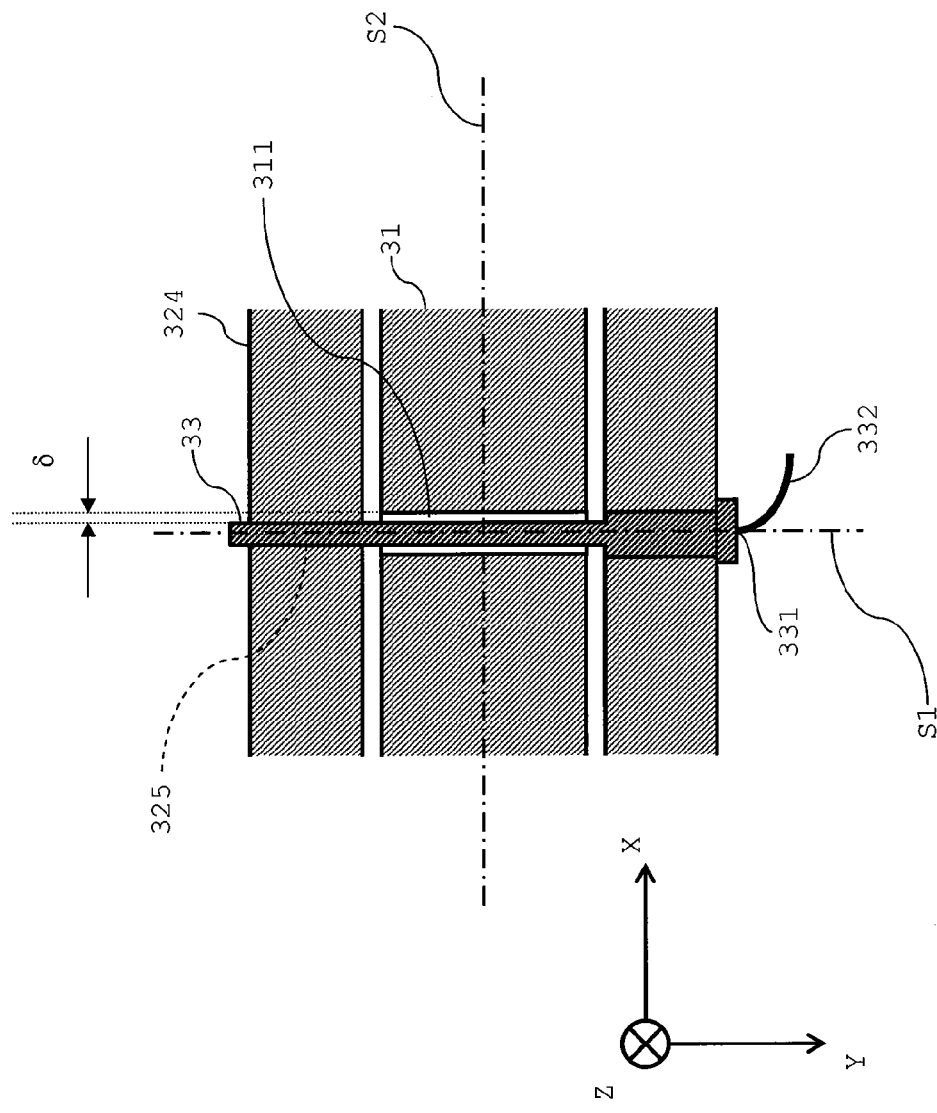
FIG. 5 is a schematic enlarged cross-sectional view of a heater insertion hole, a heater holding hole and a heater of a bonding tool according to another embodiment of the present invention.
Figure 6:
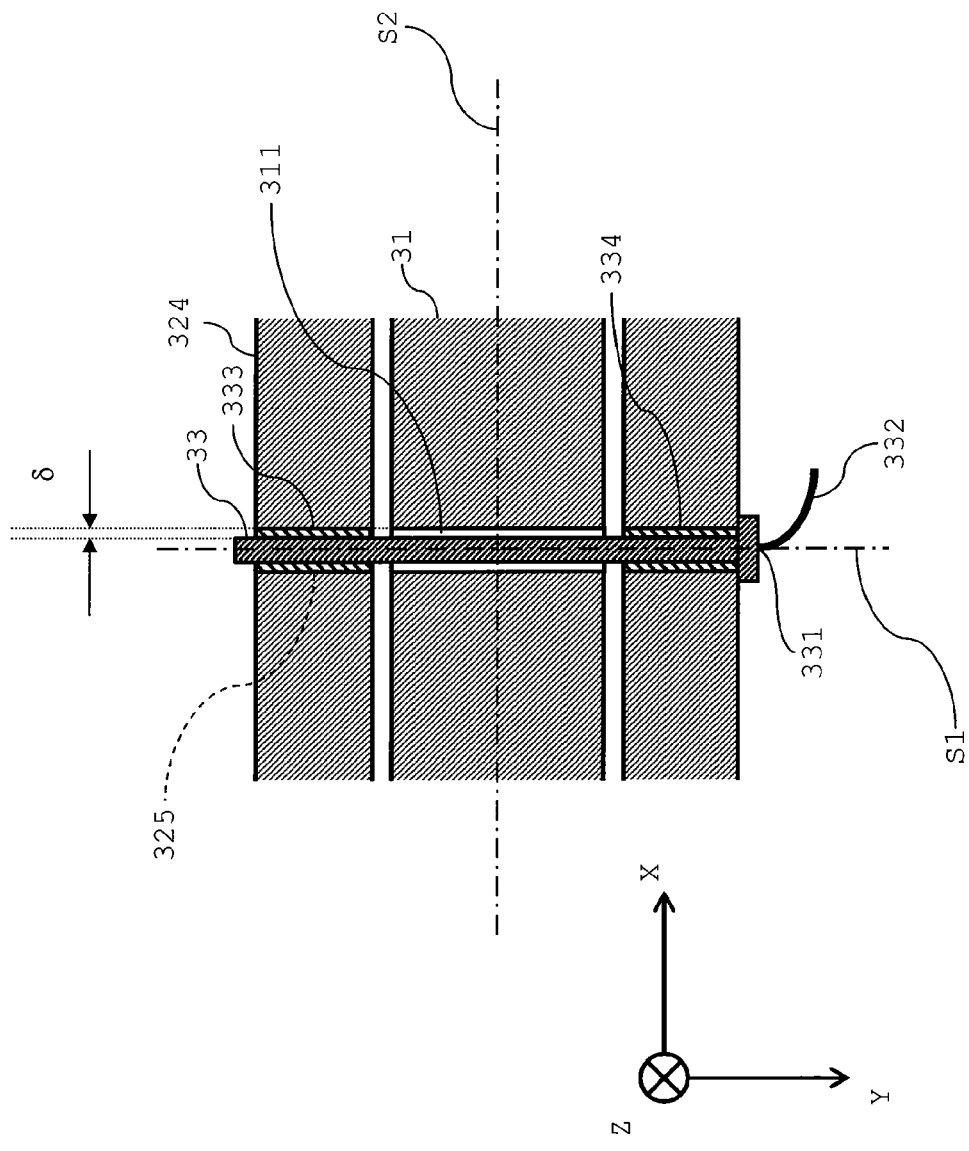
FIG. 6 is a schematic enlarged cross-sectional view of a heater insertion hole, a heater holding hole and a heater of a bonding tool according to yet another embodiment of the present invention.
Figure 7:
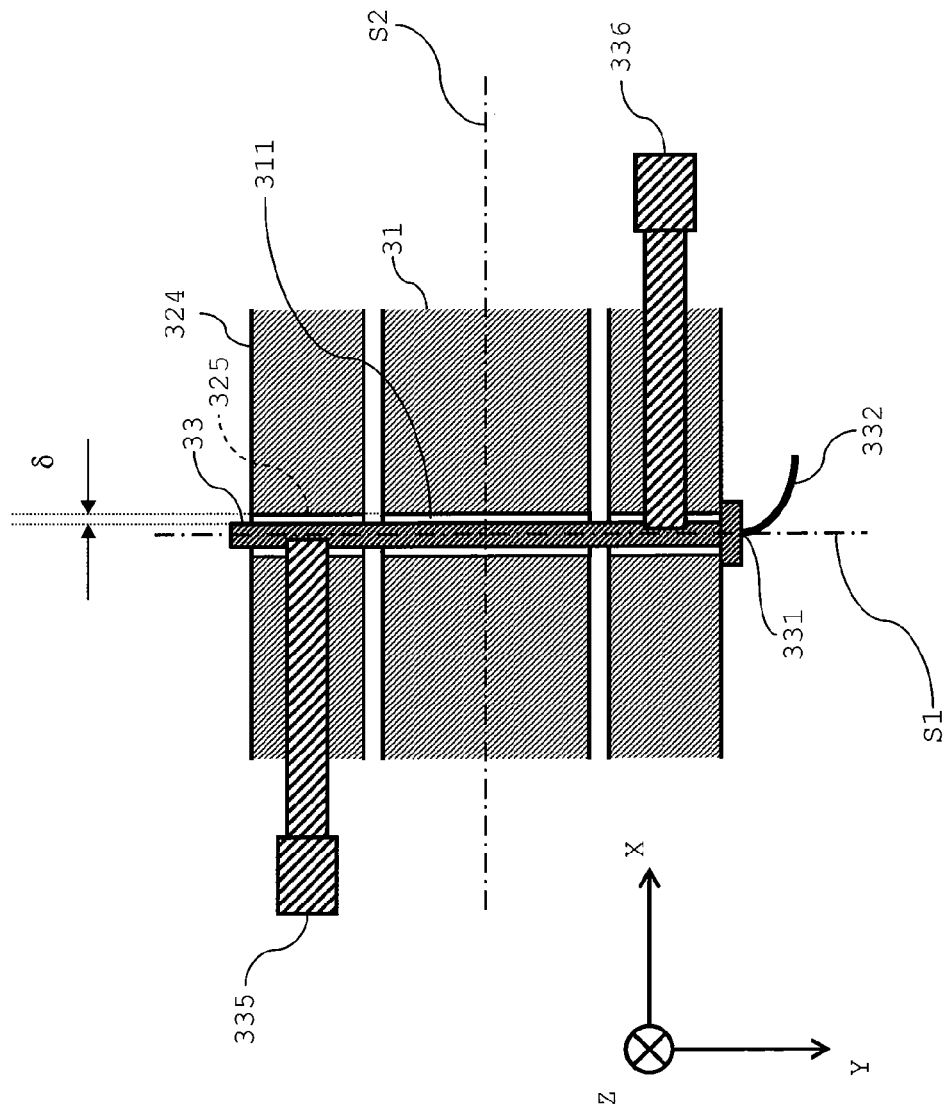
FIG. 7 is a schematic enlarged cross-sectional view of a heater insertion hole, a heater holding hole and a heater of a bonding tool according to yet another embodiment of the present invention.

Yet, the predetermined clearance may be created in other ways as illustrated in FIGS. 5 through 7.

Operation of the electronic component mounting apparatus and the electronic component mounting method according to the embodiment described above are summarized below.

1. First, the bonding tool 3 holds an electronic component 1 (electronic component holding step).

2. The circuit board holding unit 6 holds a circuit board 2 (circuit board holding step).

3. Then, the pressing unit 8 presses the electronic component 1 held by the bonding tool 3 against the circuit board 2 held by the circuit board holding unit 6 (pressing step).

More specifically, the pressing unit 8 transmits the driving force from the actuator 85 to the coupling section 81 through the block 82.

The pressing unit 8 then moves the bonding head 7 holding the bonding tool 3 in the Z direction along the guide 84.

Thus, the electronic component 1 held by the bonding tool 3 is pressed against the circuit board 2.

4. The ultrasonic transducer 4 produces ultrasonic vibration (ultrasonic vibration producing step).

5. The heater 33 heats the electronic component holder 9 (heating step).

The steps of pressing, producing ultrasonic vibration, and heating are performed at the same time, of course.

Thus, electrodes of the electronic components 1 are bonded to electrodes on the circuit board 2 by using heat and ultrasonic vibration.

The electronic component mounting apparatus and method according to the present embodiment can use the bonding tool 3 configured as described above to achieve high-quality ultrasonic bonding.

Alternative embodiments will be described next.

FIGS. 5 through 7 are schematic enlarged cross-sectional views of and around the heater insertion hole 311 and the heater holding hole 325 of bonding tools 3 according to embodiments of the present invention.

In the embodiment illustrated in FIG. 5, a predetermined clearance is created by reducing the diameter of the main body and the tail by cutting. The heater 33 in this embodiment is easy to fabricate than the heater 33 illustrated in FIG. 4. However, since the heater holding hole 325 and the heater insertion hole 311 differ in diameter, it is difficult to precisely align the central axes of both holes with each other and therefore wobbling can occur.

A predetermined clearance in the embodiment illustrated in FIG. 6 is created by reducing the diameter of the head, main body, and tail by cutting. In this embodiment, high cutting precision can be considerably easily achieved because the clearance can be created simply by cutting all of the head, main body and tail. On the other hand, a difficulty lies in attaching spacers 333, 334 (see FIG. 6) which are inserted in all or part of the space between the heater 33 and the heater holding hole 325.

A predetermined clearance in the embodiment illustrated in FIG. 7 is created by using three bolts 335, 336 instead of the spacers 333, 334 in FIG. 6. Specifically, the bolts 335, 336 are used to directly hold the heater 33 in the XZ plane at three points 120 degrees apart and the turning of the three bolts is adjusted to create a clearance. In this case, the heater 33 can be easy to fabricate.

In the embodiments described above uses a single heater 33 as illustrated in FIGS. 2 and 3.

Figure 8:
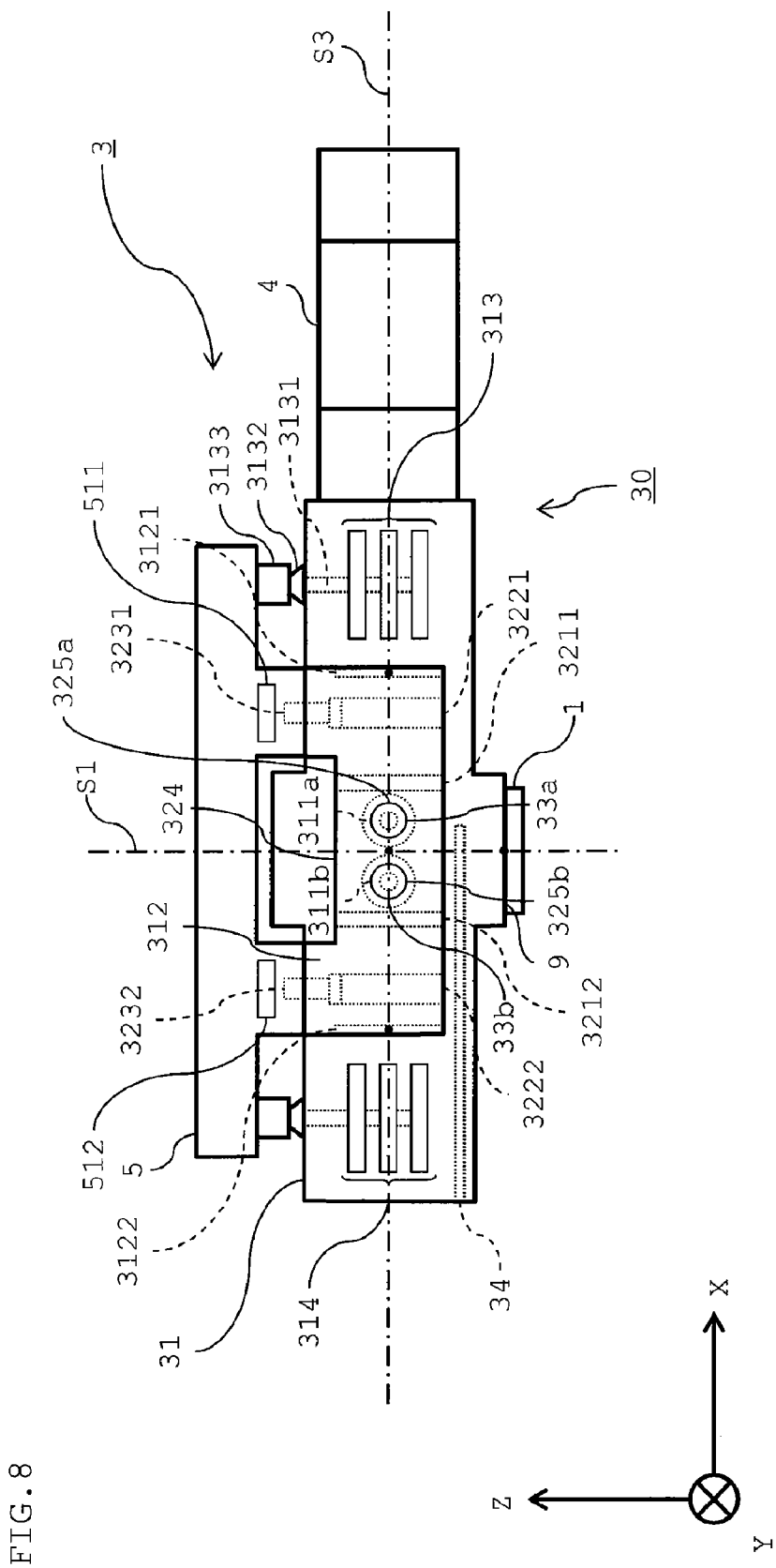
FIG. 8 is a schematic front elevation view of a bonding tool according to another embodiment of the present invention.
Figure 9:
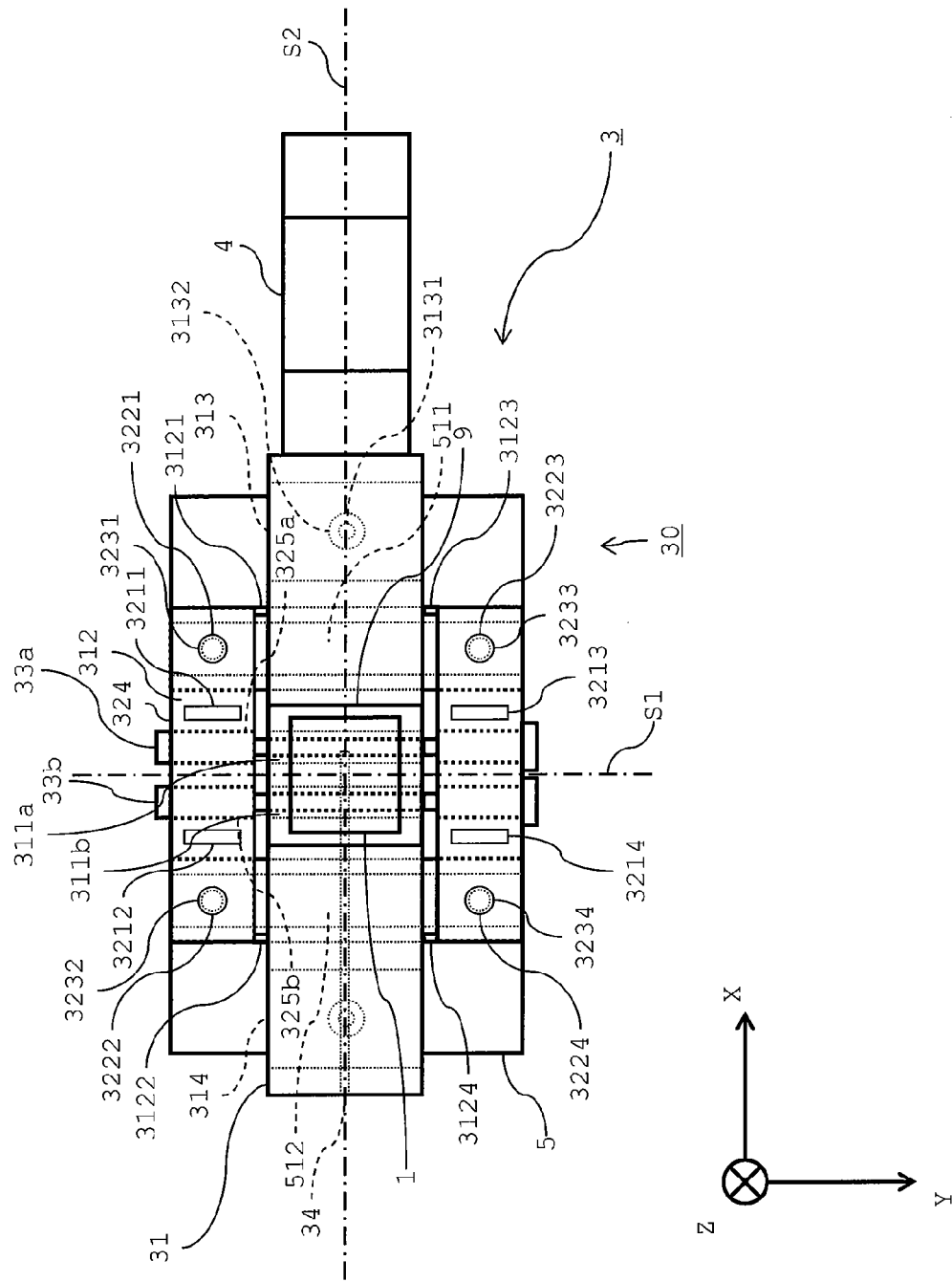
FIG. 9 is a schematic bottom view of the bonding tool according to the embodiment of the present invention depicted in FIG. 8.

However, two heaters may be provided as illustrated in FIGS. 8 and 9.

FIG. 8 is a schematic front elevation view of a bonding tool 3 according to an embodiment of the present invention. FIG. 9 is a schematic bottom view of the bonding tool 3 according to the embodiment of the present invention.

The heaters 33a and 33b in the embodiment illustrated in FIGS. 8 and 9 are cartridge heaters or the like.

Heater insertion holes 311a and 311b and heater holding holes 325a and 325b are formed correspondingly to the two heaters 33a and 33b, respectively.

The heater insertion holes 311a and 311b are formed symmetrically with respect to a plane of symmetry S1. The heater insertion hole 311a is formed on the +X side of the plane of symmetry S1 completely through the horn 31 in the Y direction. The heater insertion hole 311b is formed on the −X side of the plane of symmetry S1 completely through the horn 31 in the Y direction.

Heater holding holes 325a and 325b are formed symmetrically with respect to the plane of symmetry S1. The heater holding hole 325a is formed on the +X side of the plane of symmetry S1 completely through the heater holder 324 in the Y direction. The heater holding hole 325b is formed on the −X side of the plane of symmetry S1 completely through the heater holder 324 in the Y direction.

This embodiment has the advantage that the electronic component holder 9 holding an electronic component 1 can be heated more efficiently. However, the heaters 33a and 33b can come into contact with the walls of the heater insertion holes 311a and 311b because of asymmetry of heating arising from the orientation of the heaters 33a and 33b.

Figure 10:
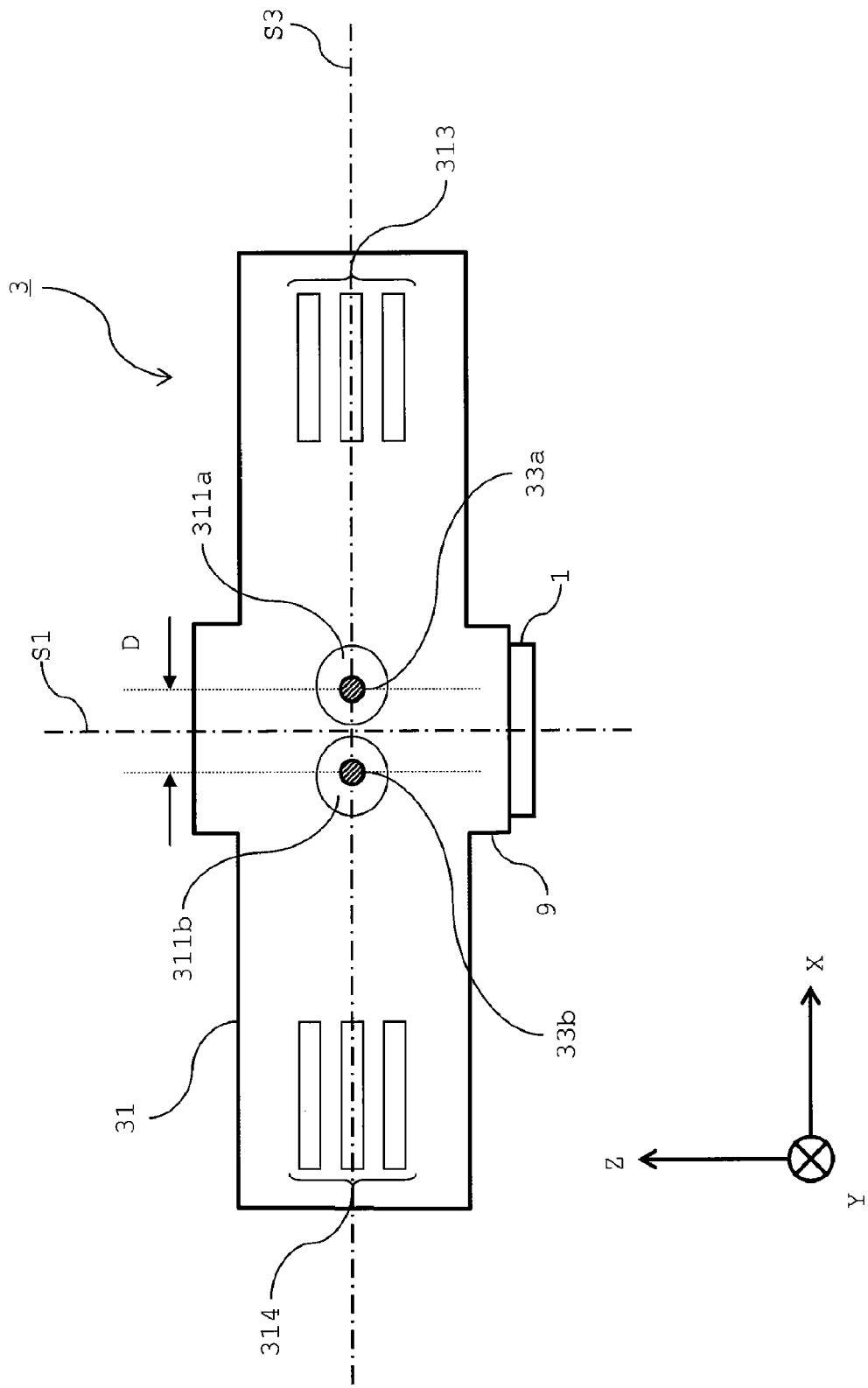
FIG. 10 is a schematic front elevation view of a heater insertion hole of the bonding tool according to the embodiment of the present invention depicted in FIG. 8.
Figure 11:
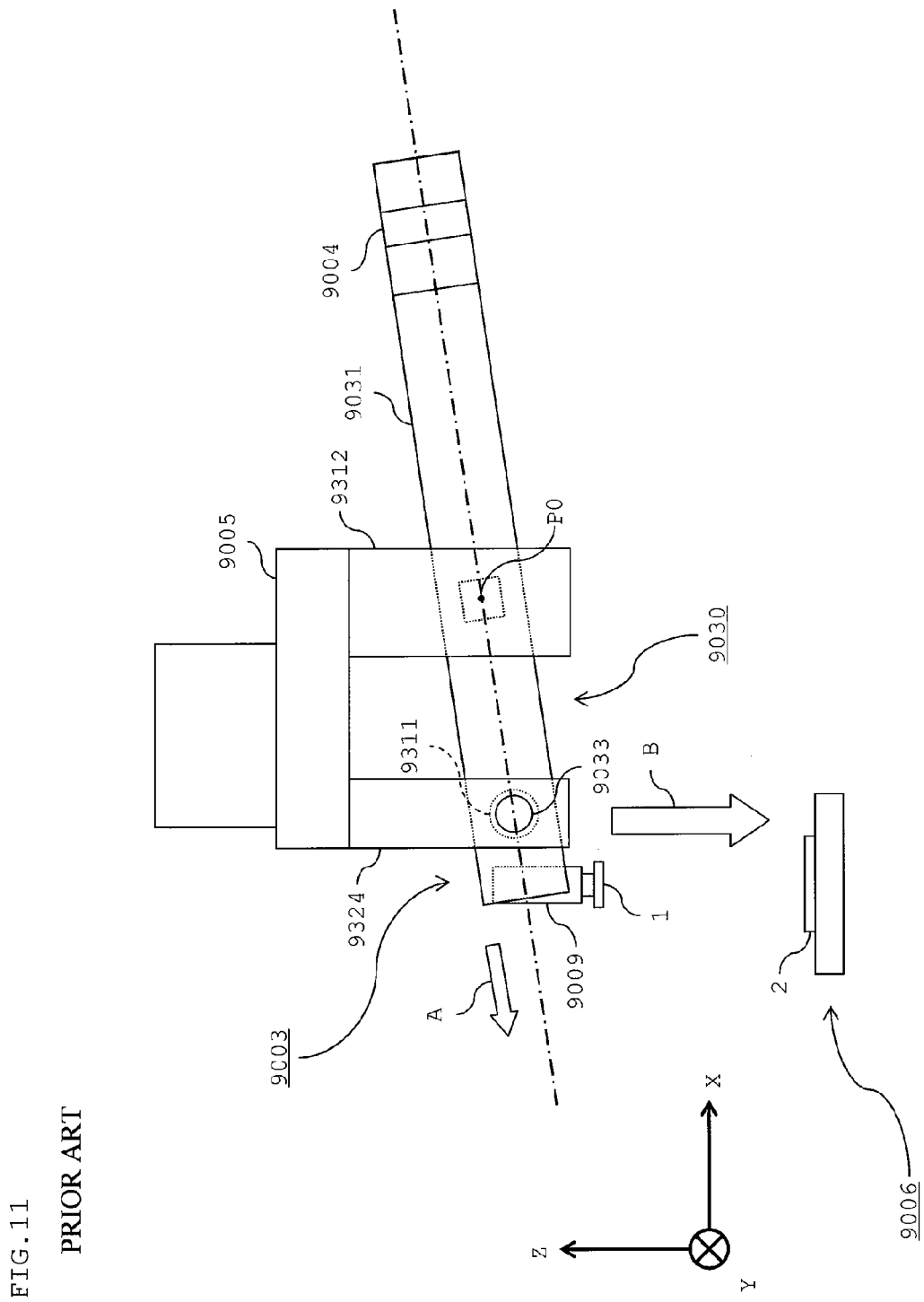
FIG. 11 is a schematic front elevation view of a conventional electronic component mounting apparatus.

In order to overcome the drawback, the aperture of each of the heater insertion holes 311a and 311b may be made into the shape of an ellipse elongated in the X direction in which ultrasonic vibration is transmitted, as depicted in FIG. 10.

FIG. 10 is a schematic front elevation view of and around the heater insertion holes 311a and 311b of the bonding tool 3 according to an embodiment of the present invention.

Specifically, since the heater insertion hole 311a is formed on the +X side of the plane of symmetry S1 and the heater insertion hole 311b is formed on the −X side of the plane of symmetry S1 as described above, the horn 31 thermally expands in the X direction at a higher rate than in other direction.

More specifically, when the temperatures of the heaters 33a and 33b during heating are approximately 500 to 600 degrees C., the temperature of the electronic component 1 heated will be approximately 300 degrees C.

If the distance D between the heaters 33a and 33b in the X direction at an ordinary temperature, that is, at approximately 0 degrees C. under non-heating conditions, is approximately 25 mm and the coefficient of linear expansion of the horn 31 is approximately 0.000013/K, the distance D in the X direction in the presence of heat will be greater than the distance D in the absence of heat by approximately 0.0975 (=0.000013× 25×300) mm and, as a result, the apertures of the heater insertion holes 311a and 311b will be compressed in the X direction.

However, if the apertures of the heater insertion holes 311a and 311b are formed into the shape of an ellipse elongated in X direction to allow for the compression, the likelihood that the heaters 33a and 33b will come into contact with the walls of the heater insertion holes 311a and 311b during heating by the heaters 33a and 33b is significantly reduced.

According to the embodiment illustrated in FIG. 10, the problem of contact caused by expansion can be avoided more reliably in this way even though more than one heater is used.

In any of the embodiments described above, the leg 312 is formed integrally with the heater holder 324 from a single material by wire cutting. However, the leg 312 and the heater holder 324 may be formed separately and then joined or coupled into one unit, for example.

The term "symmetrical" as used in the foregoing does not necessarily mean "symmetrical" in a mathematically exact sense but instead includes the notion "asymmetrical" to an extent without departing from the object of the present invention.

A bonding tool, an electronic component mounting apparatus, and an electronic component mounting method according to the present invention are capable of ultrasonic bonding of improved quality and are useful in applications such as semiconductor flip-chip mounting.

What is claimed is:

1. A bonding tool, comprising:
    a component mounting unit including
        a horn that has a heater insertion hole, in which a heater is inserted with a predetermined clearance from a wall of the heater insertion hole, so that the heater is not in contact with the horn and transmits ultrasonic vibration,
        an ultrasonic transducer that is fixed on the horn and produces the ultrasonic vibration, and
        an electronic component holder that is fixed on the horn, holds an electronic component and is heated by the heater;
    a leg that supports the horn on both sides of the horn at nodal points of the ultrasonic vibration on the horn;
    a supporter that holds the leg; and
    a heater holder that holds the heater on both sides of the horn, wherein
        the leg and the heater holder are formed integrally with each other, the leg is provided on both sides of the horn, and each part of the leg on each side is separated into two parts spaced apart by a predetermined distance along a direction in which the ultrasonic vibration is transmitted, so that the leg supports the horn at four locations, and
        the heater holder is provided on both sides of the horn, being separated into two parts arranged along a direction orthogonal to the direction in which the ultrasonic vibration is transmitted, and each part of the heater holder on each side is disposed in the in-between space between the two parts of each part of the leg.

2. The bonding tool according to claim 1, wherein each part of the leg separated into the two parts spaced apart by the predetermined distance and each part of the heater holder disposed in the in-between space are formed integrally with each other.

3. The bonding tool according to claim 2, wherein
    the supporter has a shape of a plate,
    the leg is fixed on a bottom surface of the supporter,
    the heater holder is disposed alongside the leg, and
    a predetermined space is formed between the supporter and the heater holder.

4. The bonding tool according to claim 3, wherein
    the horn has a shape of a prism with a longitudinal direction in which the ultrasonic vibration is transmitted,
    the heater insertion hole is bored completely through the horn in the direction orthogonal to the direction in which the ultrasonic vibration is transmitted, and
    a heater holding hole for holding the heater is formed in the heater holder provided on both sides of the horn, respectively.

5. The bonding tool according to claim 4, wherein
    the heater has a shape of a cylinder, and
    a central axis of the heater holding hole coincides with a central axis of the heater insertion hole.

6. The bonding tool according to claim 5, wherein
    the heater insertion hole is bored completely through the horn in a direction orthogonal to side surfaces on both sides of the horn.

7. The bonding tool according to claim 6, wherein
    the heater has two heaters,
    the heater insertion hole and the heater holding hole are formed correspondingly to the two heaters, respectively, and
    an aperture of each of the heater insertion holes has a shape of an ellipse elongated in the direction in which the ultrasonic vibration is transmitted.

8. The bonding tool according to claim 6, wherein
    the central axis of the heater insertion hole is orthogonal to a central axis of the horn in the longitudinal direction, and
    the heater insertion hole is symmetrical with respect to a plane that includes the central axis of the heater insertion hole and is orthogonal to the central axis of the horn in the longitudinal direction.

9. The bonding tool according to claim 6, wherein
    the central axis of the heater insertion hole is orthogonal to a central axis of the horn in the longitudinal direction, and
    the heater insertion hole is symmetrical with respect to a plane that includes the central axis of the horn in the longitudinal direction and is orthogonal to the central axis of the heater insertion hole.

10. The bonding tool according to claim 6, wherein
    the central axis of the heater insertion hole is orthogonal to a central axis of the horn in the longitudinal direction, and
    the heater insertion hole is symmetrical with respect to a plane that includes the central axis of the heater insertion hole and the central axis of the horn in the longitudinal direction.

11. The bonding tool according to claim 6, wherein
    four locations at which the leg is fixed on the supporter are symmetrical with respect to a plane that includes the central axis of the heater insertion hole and is orthogonal to a central axis of the horn in the longitudinal direction and further symmetrical with respect to a plane that includes the central axis of the horn in the longitudinal direction and is orthogonal to the central axis of the heater insertion hole.

12. The bonding tool according to claim 1, wherein the horn has, as a cooling unit, air holes.

13. The bonding tool according to claim 1, wherein air holes are formed in locations in the leg that are adjacent to the heater holder.

14. The bonding tool according to claim 1, wherein air holes are formed in locations in the supporter that are adjacent to the leg.

15. The bonding tool according to claim 1, wherein a thermometer insertion hole, into which a thermometer is inserted, is formed in the horn.

16. The bonding tool according to claim 1, wherein an amount of the predetermined clearance is equal to or more than 0.075 mm and is equal to or less than 0.1 mm.

17. An electronic component mounting apparatus, comprising:
the bonding tool according to claim 1 that holds the electronic component;
a circuit board holding unit that holds a circuit board; and
a pressing unit that presses the electronic component held by the bonding tool against the circuit board held by the circuit board holding unit.

18. An electronic component mounting method of mounting the electronic component on the circuit board using the electronic component mounting apparatus according to claim 17, the electronic component mounting method comprising:
an electronic component holding step of holding the electronic component using the bonding tool;
a circuit board holding step of holding the circuit board using the circuit board holding unit;
a pressing step of pressing the electronic component held by the bonding tool against the circuit board held by the circuit board holding unit using the pressing unit;
an ultrasonic vibration producing step of producing the ultrasonic vibration using the ultrasonic transducer; and
a heating step of heating the electronic component holder using the heater.

* * * * *